United States Patent [19]

Chen et al.

[11] Patent Number: 4,978,870

[45] Date of Patent: Dec. 18, 1990

[54] CMOS DIGITAL LEVEL SHIFTER CIRCUIT

[75] Inventors: Ming-Daw Chen; Nang-Ping Tu, both of Hsin Chu, Taiwan

[73] Assignee: Industrial Technology Research Institute, Taiwan

[21] Appl. No.: 382,136

[22] Filed: Jul. 19, 1989

[51] Int. Cl.$^5$ ............... H03K 19/094; H03K 19/0175; H03K 3/284

[52] U.S. Cl. .................................. 307/475; 307/451; 307/482; 307/272.1; 307/272.2

[58] Field of Search ............... 307/443, 448, 451, 475, 307/482, 272.1, 272.2, 264

[56] References Cited

U.S. PATENT DOCUMENTS 4,786,830 11/1988 Foss ..................................... 307/264
4,801,826 1/1989 Cornelissen .......................... 307/482

Primary Examiner—Stanley D. Miller
Assistant Examiner—Margaret Rose Wambach
Attorney, Agent, or Firm—Darby & Darby

[57] ABSTRACT

The apparatus of the present invention is a CMOS digital level shifter circuit which includes an inverter connected to a voltage generator. The voltage generator comprises an NMOS source follower connected to a directional switching element and a voltage regulating capacitor. The level shifter further includes a latch energized by the same voltage supply energizing the voltage generator. Each branch of the latch has a complementary MOS transistor pair with common gates connected to the output of the inverter and to the input signal respectively. Each complementary transistor pair is connected to the voltage supply by a latch transistor whose gate is cross-connected to the complementary transistor pair of the other branch. Whenever the one transistor in each complementary pair which is connected to ground is on, the latch transistor is latched off by the complementary transistor pair in the other branch after each voltage transition by the input signal, thereby reducing or eliminating DC power consumption, while requiring only a single voltage supply.

12 Claims, 3 Drawing Sheets

CMOS DIGITAL LEVEL SHIFTER CIRCUIT

TECHNICAL FIELD

The present invention relates to a complementary metal oxide semi-conductor (CMOS) voltage shifting logic circuit characterized by low direct current (DC) power consumption and which requires only a single voltage supply source.

BACKGROUND OF THE INVENTION

A voltage level shifter circuit is required whenever a signal must be transferred from one circuit operating at a lower voltage level to another circuit operating at a higher voltage level. In typical logic circuits, devices such as logic gates or components operate at lower voltage levels, while devices such as electrically programmable read-only memories (EPROM's) operate at higher voltage levels. As one example, in a first circuit operating at a lower voltage level the signal voltage varies between 0 and 5 volts, while in a second circuit operating at a higher voltage level the signal voltage varies between 0 and 18 volts. In the latter example, in order to transfer the signal from the first circuit to the second circuit, the peak voltage level of the signal must first be shifted by a voltage level shifter circuit from 5 volts to 18 volts.

FIG. 1 shows a typical prior art digital level shifter circuit including a first inverter 10 having a P-channel MOS (PMOS) transistor 11 and an N-channel MOS (NMOS) transistor 13 forming a first CMOS transistor pair. The source of the PMOS transistor 11 is connected to a first voltage supply $V_{CC}$, the source of the NMOS transistor 13 being grounded while the drains of the transistors 11, 13 are connected to an output 14. The output 14 is connected to the gates of a second CMOS transistor pair comprising a PMOS transistor 16 and an NMOS transistor 17 in a second inverter 15. A signal applied to input node 12 of the first inverter 10 is inverted at the output 14. The inverted signal is then reinverted by the inverter 15. The source of the PMOS transistor 16 is connected to a second voltage supply $V_{DD}$ characterized by a higher voltage than the first voltage supply so that the re-inverted signal at output node 18 of the second inverter 15 has a peak voltage shifted up or increased with respect to the peak voltage of the signal at the input node 12.

During each transition of the signal at the input node 12 between 0 volts and its peak voltage (5 volts, for example), both of the transistors 16 and 17 in the second inverter 15 may be on, but after such a transition is finished one or the other of the transistors 16, 17 should be off (virtually non-conducting) in order to prevent direct current power dissipation from the voltage supply $V_{DD}$ to ground. The disadVantage of the level shifter circuit of FIG. 1 is that the PMOS transistor 16 has a tendency to remain on as a consequence of its threshold voltage even after the NMOS transistor 17 has turned on following a transition by the input signal. With both transistors on, a path exists permitting DC power dissipation, a significant problem.

FIG. 2 shows a level shifter circuit disclosed in U.S. Pat. No. 4,486,670 which prevents DC power dissipation of the type experienced in the level shifter circuit of FIG. 1. However, a significant disadvantage of the level shifter circuit of FIG. 2 is that it requires two different voltage supplies $V_{CC}$ and $V_{DD}$ for the two inverters 20, 25 and for the latch circuit 30.

FIG. 3 illustrates another conventional solution to the DC power consumption problem. The level shifter of FIG. 3 includes an inverter 40 and a latch circuit 45. Because not all the transistors of the complementary transistor pairs in the latch circuit 45 will be turned on after each transition of the input signal, there is no direct current path from the voltage supply $V_{DD}$ to ground. This feature solves the problem of DC power consumption. However, another problem exists in that two power supplies $V_{CC}$ and $V_{DD}$ characterized by different voltages are required to perform voltage level shifting.

A linear type MOS level shifter circuit 55 is shown in FIG. 4. It includes a current source NMOS transistor 61, a pair of current mirror PMOS transistors 56, 57 whose gates are connected together to the drain of the PMOS transistor 56, and two input stage NMOS transistors 60, 62. Only a single voltage supply $V_{DD}$ is required and it is connected to the sources of the PMOS transistors 56, 57. Gate 63 of the NMOS transistor 62 receives a reference signal which governs the difference between the voltage at input node 59 and the voltage at output node 64. A bias voltage $V_B$ is applied to the gate of the current source transistor 61. The disadvantage of the level shifter of FIG. 4 is that there is significant DC power consumption through the transistor 61.

In summary, it would seem that a voltage level shifter circuit can enjoy only one of two distinct advantages, but not both, namely that the circuit either requires only a single voltage supply or else the circuit has low DC power consumption. Thus, there is a need for a voltage level shifter circuit which provides both advantages simultaneously.

SUMMARY OF THE INVENTION

The CMOS digital voltage level shifting circuit of the invention has a voltage generator energizing an input inverter whose input node receives the input signal which is to be level shifted and whose output node is connected to a latch. The latch has two branches, each branch having a complementary NMOS and PMOS field effect transistor pair with a common drain, one of the transistors in the pair being connected to ground. A latch transistor in each branch is connected in series between the other transistor of the complementary transistor pair and a voltage supply, the gate of the latch transistor being cross-connected to the common drain of the complementary transistor pair in the other branch. Each complementary transistor pair has a common gate, one of them being connected to the input node of the input inverter and the other being connected to the output node of the input inverter, so that the two complementary transistor pairs are in opposite states. Whenever the one transistor in each complementary pair which is connected to ground is on, the latch transistor in the same branch is turned off by the voltage on the common drain of the other pair after each voltage transition by the input signal thus blocking the path from the voltage supply to ground. This minimizes or eliminates DC power consumption from the voltage supply to ground.

A single voltage supply suffices to energize the voltage generator and the latch, no other voltage supply being required. In the preferred embodiment of the invention, the input inverter produces an inverted signal having a lower peak voltage proportional to the voltage furnished by the voltage generator while the latch circuit responds to the inverted signal to produce a corresponding signal having a higher peak voltage proportional to the voltage of the single voltage supply. Thus, the level shifting circuit of the invention enjoys both the advantage of requiring only a single voltage supply and the advantage of low DC power consumption.

The voltage generator of the preferred embodiment includes an NMOS source follower transistor and a capacitor for reducing fluctuations in the voltage furnished by the source follower transistor. Further, a directional switching element (like a diode) prevents discharge of the capacitor through the source follower transistor.

BRIEF DESCRIPTION OF THE DRAWINGS

The invention is described in detail with reference to the aCCompanying drawings, of which.

Figure 5:
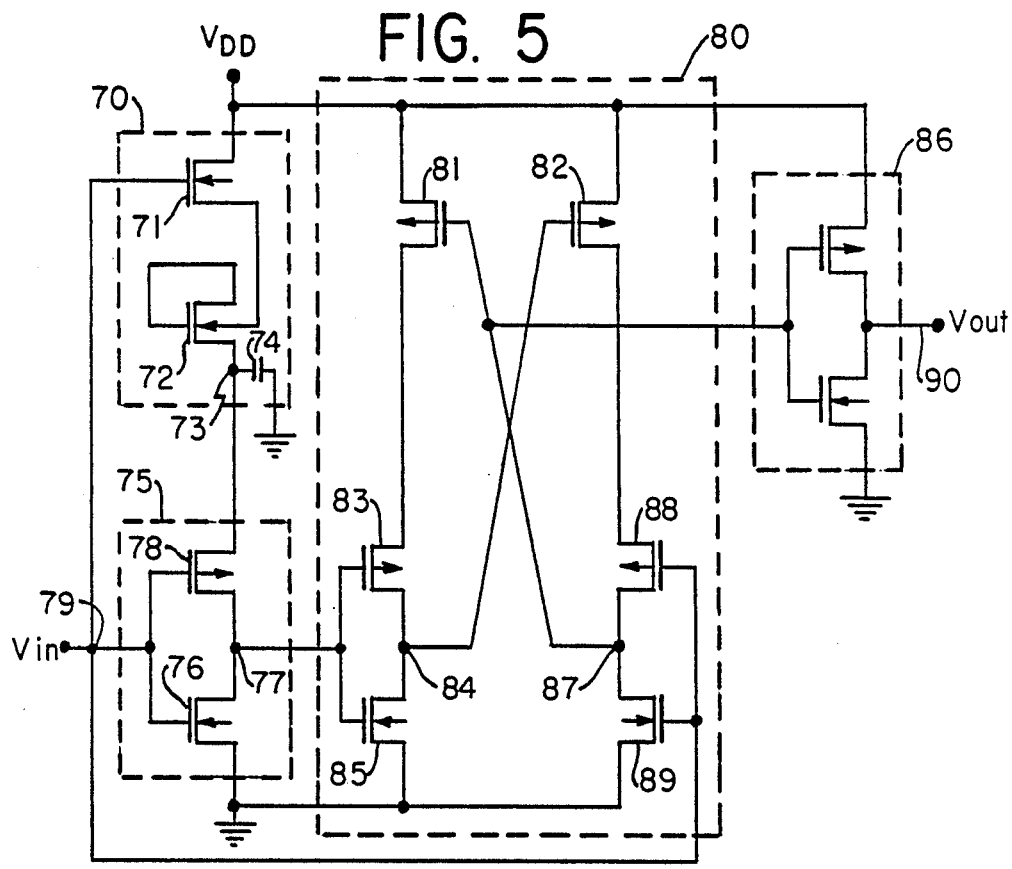
FIG. 5 is a schematic diagram of the preferred embodiment of the CMOS digital level shifting circuit of the invention.

DETAILED DESCRIPTION OF THE PREFERRED EMBODIMENT OF THE INVENTION (A) Input Inverter Referring to FIG. 5, the digital level shifter circuit of the invention has an input inverter 75 including a PMOS transistor 78 and an NMOS transistor 76 forming a CMOS transistor pair. The source of the PMOS transistor 78 is connected to output node 73 of a voltage generator 70 while the drain of the NMOS transistor 76 is connected to ground. Input node 79 receives the signal whose peak voltage level is to be shifted, the node 79 being connected to the gates of the complementary transistor pair 76, 78. The complementary transistor pair 76, 78 have a common drain 77 which is the output node of the input inverter 75.

(B) Voltage Generator

Figure 1:
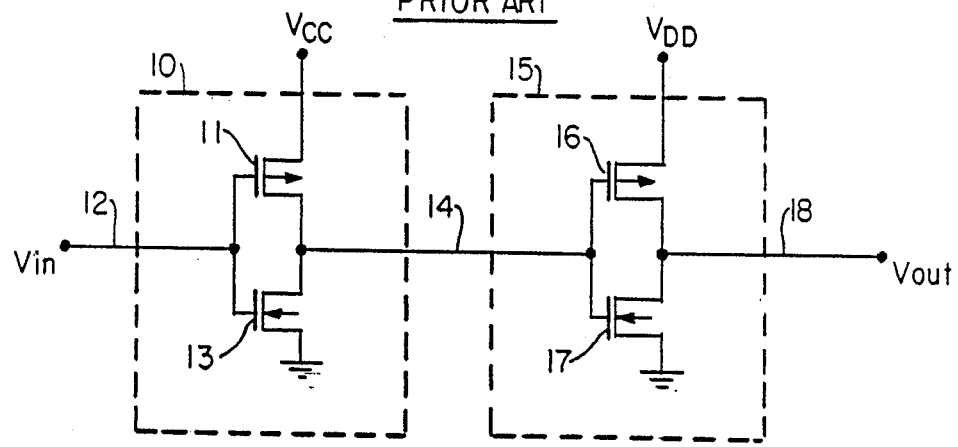
FIG. 1 is a schematic diagram of an exemplary digital level shifter circuit of the prior art.
Figure 2:
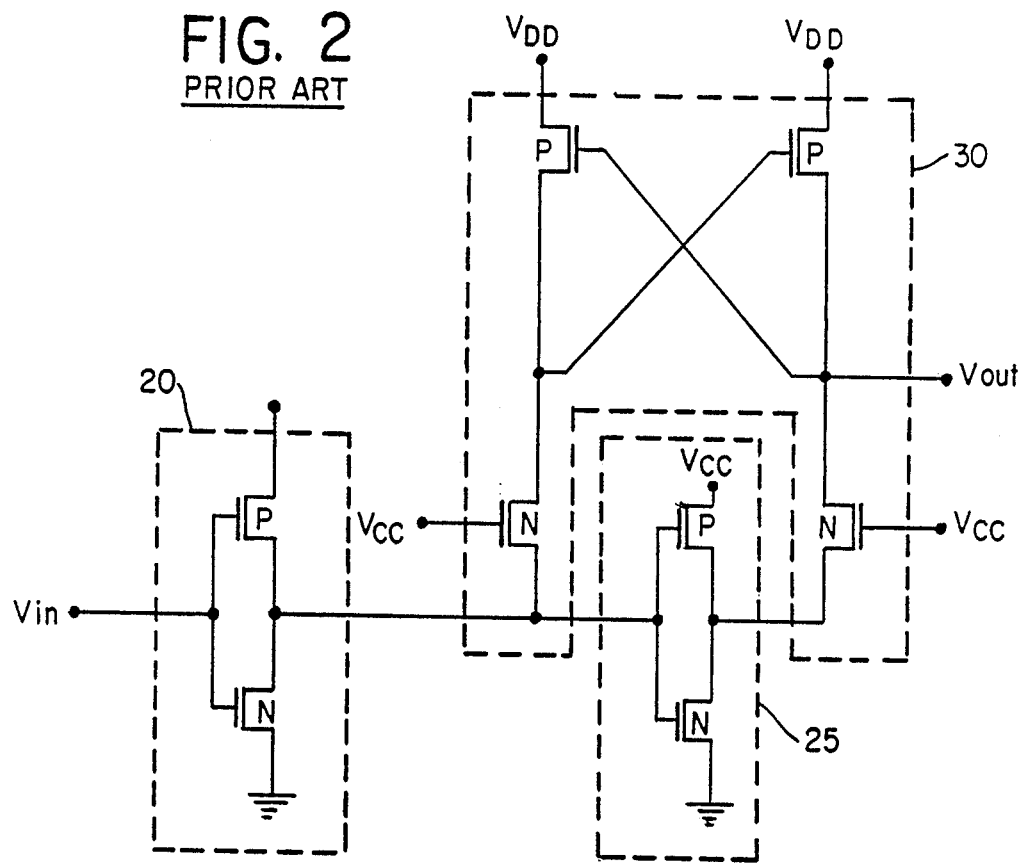
FIG. 2 is a schematic diagram of a level shifter circuit disclosed in U.S. Pat. No. 4,486,670.
Figure 3:
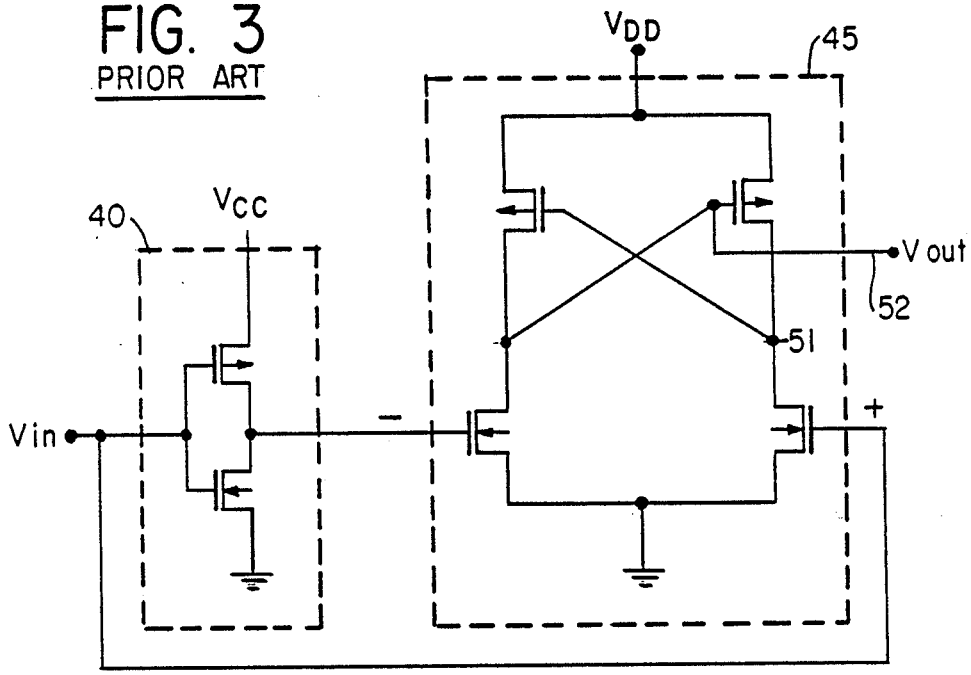
FIG. 3 is a schematic diagram of another level shifter circuit of the prior art.
Figure 4:
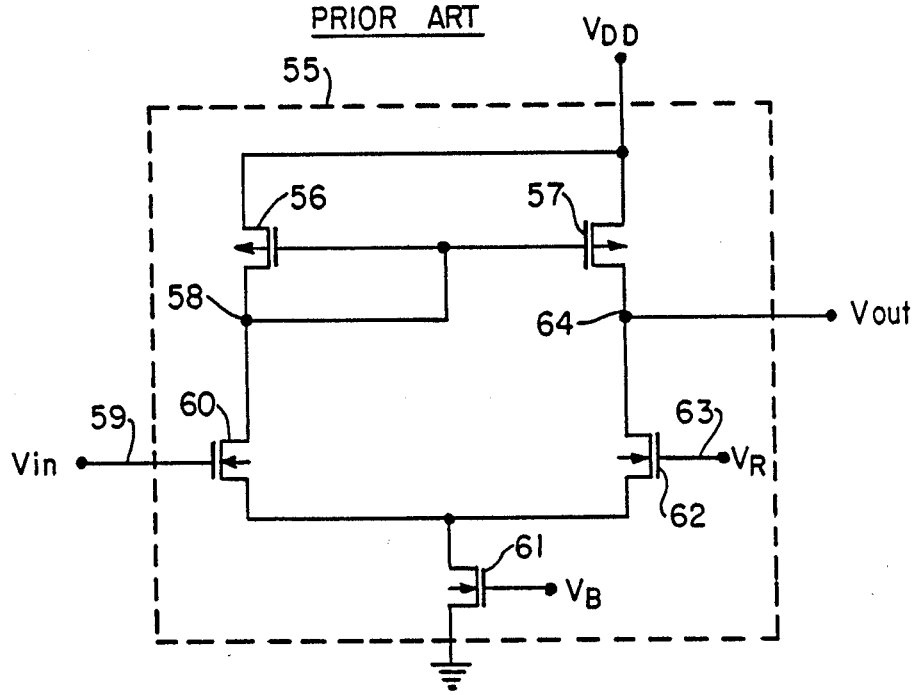
FIG. 4 is a schematic diagram of yet another level shifter circuit of the prior art.

The voltage generator 70 includes an NMOS source follower transistor 71, a directional switching element 72 and a capacitor 74 all connected in series between a voltage supply $V_{DD}$ and ground. The output node 73 of the voltage generator 70 is the connection between the capacitor 74 and the directional switching element 72. The voltage generator 70 eliminates the need for a separate voltage supply, such as the voltage supply $V_{CC}$ of FIG. 3. The NMOS source follower transistor is a field effect transistor having its source and well (or substrate) connected together. The directional switching element 72 is an NMOS field effect transistor having its gate and source connected together. The well (or substrate) of the NMOS source follower transistor 71 and directional switching element 72 are effectively connected together by well-known techniques.

The NMOS source follower transistor 71 operates so that its source voltage follows its gate voltage. For example, if the input node 79 is at 5 volts, then the source voltage of the NMOS source follower transistor 71 is at approximately $(5-V_T)$ volts, where $V_T$ is the threshold voltage of the NMOS source follower transistor 71. The directional switching element 72 permits current flow to the capacitor 74 whenever the input node 79 is at a sufficiently high voltage (e.g. about +5 volts) so as to charge the capacitor 74, and stops current flow from the capacitor through the source follower transistor 71 whenever the input node 79 is at a low voltage (e.g. about 0 volts) to avoid discharging the capacitor 74. Thus, the capacitor 74 remains sufficiently charged to compensate as needed for fluctuations in the source voltage of the source follower transistor 71 so that a regulated voltage is furnished at the output node 73 of the voltage generator 70.

(C) Latch Circuit

The latch circuit 80 includes a pair of PMOS transistors 81, 82 whose sources are connected to the voltage source $V_{DD}$. The gates of the PMOS transistor pair 81, 82 are cross-connected with the drains of a pair of NMOS transistors 85, 89 whose sources are grounded. The gate of the PMOS transistor 81 is connected to drain 87 which is common to the NMOS transistor 89 and a PMOS transistor 88. Similarly, the gate of the PMOS transistor 82 is connected to drain 84 which is common to the NMOS transistor 85 and a PMOS transistor 83. The complementary transistor pair 83, 85 have a common gate connected to the output node 77 of the input inverter 75. The complementary transistor pair 88, 89 have a common gate connected to the input node 79 of the input inverter 75. The transistors 81, 83, 85 form one branch of the latch 80 while the transistors 82, 88, 89 form the other branch of the latch 80.

(D) Output Inverter

There are two inverters 75, 86 in the circuit of FIG. 5. The input inverter 75 inverts the signal at the input node 79 to provide an inverted signal to the latch 80. The latch 80 in turn provides a voltage-level-shifted inverted signal to the output inverter 86. In response, the output inverter 86 re-inverts the signal from the latch, so that the two inverters complement each other. The result is an output signal at output node 90 of the output inverter 86 corresponding to the polarity of the signal received at the input node 79 but having its voltage level shifted with respect to the input signal.

(E) Operation

Figure 6:
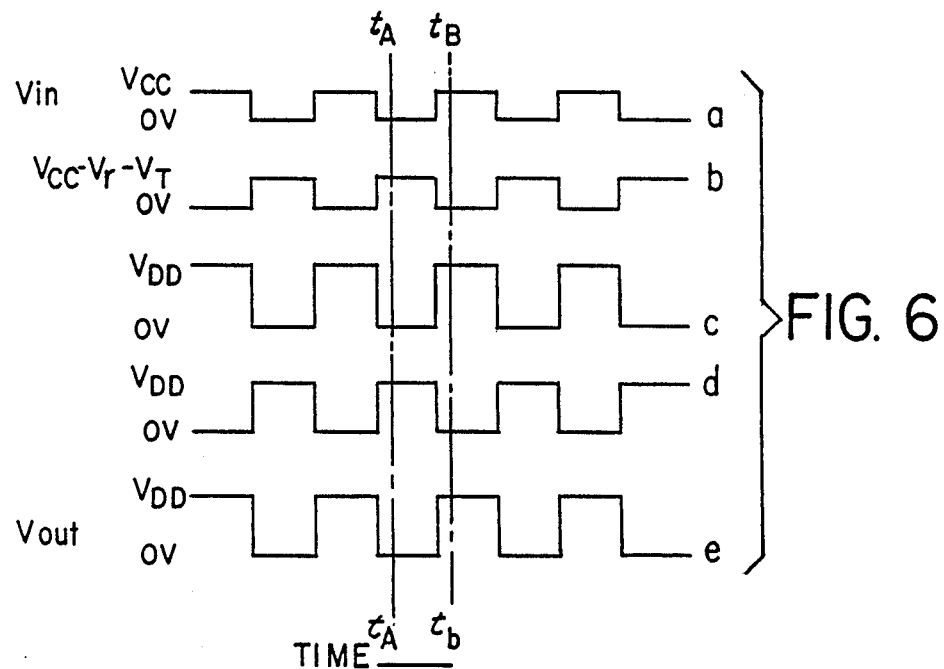
FIGS. 6a, 6b, 6c, 6d, and 6e are contemporaneous timing diagrams illustrating the voltage waveforms at respective locations in the circuit of FIG. 5 during operation.

The operation of the level shifter circuit of FIG. 5 will now be described with reference to the contemporaneous timing diagrams of FIGS. 6a through 6e. FIG. 6a illustrates the waveform of the voltage of an input signal at the input node 79. FIG. 6b illustrates the waveform of the voltage at the output node 77 of the input inverter 75. FIG. 6c illustrates the waveform of the voltage at the common drain node 84 of the latch 80. FIG. 6d illustrates the waveform of the voltage at the common drain and output node 87 of the latch 80. FIG. 6e illustrates the waveform of the output voltage of the level shifter circuit of FIG. 5 at the output node 90.

The latch circuit 80 shifts the voltage level of logical HIGH input signals to a higher voltage level and latches particular transistors off after each transition of the input signal between logical HIGH and LOW voltage levels so as to prevent DC power consumption. In considering the operation of the preferred embodiment of FIG. 5, it is first assumed that digital logic HIGH and LOW signals correspond to +5 and 0 volts, respectively, at the input node 79. This corresponds to the conditions obtaining at time $t_A$ of FIGS. 6a through 6e. As indicated in FIG. 6b, a logic HIGH at the input node 79 is inverted by the inverter 75 to produce a logic LOW at the node 77 at time $t_A$. At the same time, the capacitor 74 is charged up by current flowing through the source follower transistor 71 and the directional switching element 72, pulling the voltage on the voltage generator node 73 "up" to approximately the same voltage level as the node 79 except for a small voltage drop $V_T - V_R$. ($V_R$ is the cut-in voltage across the directional sWitching element 72.) If the node 79 becomes LOW, as at time $t_B$ of FIGS. 6a through 6e, then the NMOS source follower 71 is turned off so that its source voltage follows the input node 79. At this point, the directional switching element 72 becomes reverse biased (non-conducting) and thereby prevents the capacitor 74 from discharging through the source follower 71. The voltage at the node 73 is therefore sufficient to pull up the voltage at the node 77 to a logic HIGH level, as indicated in FIG. 6b at time $t_B$. The LOW logic level at the input node 79 at time $t_B$ turns the PMOS transistor 88 on and the NMOS transistor 89 off. Simultaneously, the HIGH logic level at the output node 77 at time $t_B$ turns the NMOS transistor 85 on and the PMOS transistor 83 off. As a result, the node 84 is pulled down to a LOW logic level (ground) at time $t_B$, as indicated in FIG. 6c, turning on the PMOS transistor 82 so as to pull the node 87 up to a HIGH logic level, as indicated at time $t_B$ in FIG. 6d. The signal at the node 87 is inverted by the output inverter 86, pulling the output node 90 down to a LOW logic level, as indicated at time $t_B$ in FIG. 6e. This of course corresponds to the logic level of the input node 79 at time $t_B$ indicated in FIG. 6a. Here, the PMOS transistor 82 latches the PMOS transistor 81 off while the NMOS transistor 85 is on. Significantly, the PMOS transistors 81 and 83 are both off at this time, which blocks current flow from the voltage supply $V_{DD}$ to the transistor 85 (which is on at this time). This prevents undesirable current flow to ground, thus minimizing DC power dissipation.

Returning again to time $t_A$ of FIGS. 6a through 6e, a HIGH logic level at the input node 79 (FIG. 6a) produces a LOW level at the node 77 (FIG. 6b), the node 84 (FIG. 6c) being pulled up to the voltage level of the supply $V_{DD}$ and the node 87 (FIG. 6d) being pulled down to ground. As a result, the voltage at the final output node 90 (FIG. 6e) is higher that the logic HIGH voltage level at the input node 79.

The conductivity types of the transistors may be reversed along with the connections to ground and the voltage supply $V_{DD}$ with respect to that shown in FIG. 5 in the latch circuit of the invention.

While the invention has been described in detail by specific reference to the preferred embodiment thereof, it is understood that variations and modifications thereof may be made without departing from the true spirit and scope of the invention.

Accordingly, what is claimed is:

1. In a digital level shifting circuit having a single voltage supply and inverter means for inverting an input signal characterized by a first peak voltage level to produce therefrom an inserted signal, the improvement comprising:

voltage generator circuit means energized by said voltage supply for providing an internally generated supply voltage to said input inverter means, and latch means energized by said voltage supply and having tow branches, each of said branches having transistor means, each transistor means having a commonly connected drain and a commonly connected gate, the commonly connected gate of one of said transistor means being connected to receive said inverted signal, said transistor means in each of said branches comprising a complementary transistor pair comprising an NMOS transistor and a PMOS transistor, the commonly connected gate of the other one of said transistor means being connected to receive said input signal, whereby at the commonly connected drain of the other transistor means is produced a shifted voltage characterized by a second peak voltage level corresponding to the voltage of said voltage supply.

2. The improvement of claim 1 wherein said second peak voltage is greater than said first peak voltage.

3. The improvement of claim 1 wherein said voltage generator circuit means comprises:

capacitor means;

a source follower transistor connected between said voltage supply source and said capacitor means, said source follower transistor having a gate connected to receive said input signal; and a directional switching means connected between said source follower transistor and said capacitor means for preventing discharge of said capacitor means through said source follower means, whereby said capacitor means compensates for fluctuations in the source voltage of said source follower transistor, said capacitor means being further connected to said input inverter so as to furnish said internally generated supply voltage to said input inverter.

4. The improvement of claim 2 wherein said internally generated supply voltage furnished by said voltage generator circuit means is less than the voltage of said voltage supply.

5. In a digital level shifting circuit having a single voltage supply and input inverter means for inverting an input signal characterized by a first peak voltage level to produce therefrom an inverter signal, the improvement comprising:

voltage generator circuit means energized by said voltage supply for providing an internally generated supply voltage to said input inverter means, and latch means energized by said voltage supply and having two branches, each of said branches having transistor means, each transistor means having a commonly connected drain and a commonly connected gate, the commonly connected gate of one of said transistor means being connected to receive said inverted signal, said transistor means in each of said branches comprising a complementary transistor pair comprising an NMOS transistor and a PMOS transistor, the commonly connected gate of the other one of said transistor means being connected to receive said input signal, whereby at the commonly connected drain of the other transistor means is produced a shifted voltage characterized by a second peak voltage level corresponding to the voltage of said voltage supply, each of said branches of the other branch, whereby current flow from said voltage supply through each of said branches is blocked by either said third transistor or one of the transistors of the complementary transistor pair in the same branch following each voltage transition of said input signal.

6. The improvement of claim 5 further comprising output inverter means, wherein the commonly connected drain of said other one of said transistor means is connected to an input node of said output inverter means.

7. In a digital level shifting circuit having a single voltage supply and input inverter means for inverting an input signal characterized by a first peak voltage level to produce therefrom an inverted signal, the improvement comprising:

voltage generator circuit means energized by said voltage supply for providing an internally generated supply voltage to said input inverter means, and latch means energized by said voltage supply and having two branches, each of said branches having transistor means, each transistor means having a commonly connected drain and a commonly connected gate, the commonly connected gate of one of said transistor means being connected to receive said inverted signal, whereby at the commonly connected drain of the other transistor means is produced a shifted voltage characterized by a second peak voltage level corresponding to the voltage of said voltage supply, said voltage generator circuit means comprising:

capacitor means;

a source follower transistor connected between said voltage supply source and said capacitor means, said source follower transistor having a gate connected to receive said input signal and directional switching means connected between said source follower transistor and said capacitor means for preventing discharge of said capacitor means through said source follower means, whereby said capacitor means compensates for fluctuations in the source voltage of said source follower transistor, said capacitor means being further connected to said input inverter so as to furnish said internally generated supply voltage to said input inverter, said directional switching means comprising a switching transistor having a source and a gate connected together and having a drain connected to said capacitor means, said source follower transistor and said switching transistor having channels which are connected together.

8. A digital level shifting circuit having a single voltage supply, comprising:

input inverter means for inverting an input signal characterized by a first peak voltage level to produce therefrom an inverted signal;

voltage generator circuit means energized by said voltage supply for providing an internally generated supply voltage different from the voltage of said single voltage supply to said input inverter means, and latch means energized by said voltage supply and having two branches, each of said branches having a pair of complementary transistors, each pair having commonly connected drains and gates, the commonly connected gate of one of said transistor pairs being connected to receive said inverted signal, whereby at the commonly connected drain of the other transistor pair is produced a shifted voltage characterized by a second peak voltage level corresponding to the level of said voltage supply, the commonly connected gate of the other one of said transistor pairs being connected to receive said input signal.

9. The circuit of claim 8 wherein said voltage generator circuit means comprises:

capacitor means;

a source follower transistor connected between said voltage supply source and said capacitor means, said source follower transistor having a gate connected to receive said input signal; and digital switching means connected between said source follower transistor and said capacitor means for preventing discharge of said capacitor means through said source follower means, whereby said capacitor means compensates for fluctuations in the source voltage of said source follower transistor, said capacitor means being further connected to said input inverter so as to furnish said internally generated supply voltage to said input inverter.

10. A digital level shifting circuit having a single voltage supply, comprising:

input inverter means for inverting an input signal characterized by a first peak voltage level to produce therefrom an inverted signal;

voltage generator circuit means energized by said voltage supply for providing an internally generated supply voltage different from the voltage of said single voltage supply to said input inverter means, and latch means energized by said voltage supply and having two branches, each of said branches having a pair of complementary transistors, each pair having commonly connected drains and gates, the commonly connected gate of one of said transistors pairs being connected to receive said inverted signal, whereby at the commonly connected drain of the other transistor pair is produced a shifted voltage characterized by a second peak voltage level corresponding to the level of said voltage supply, each of said branches of said latch further comprising a third transistor connected in series with the respective complementary transistor pair in the respective branches, the gate of said third transistor in each branch being connected to the commonly connected drain of the complementary transistor pair of the other branche, whereby current flow from said voltage suppply through each of said branches is blocked by either said third transistor or one of the transistors of the complementary transistor pair in the same branches following each voltage transition of said input signal.

11. The circuit of claim 10 further comprising output inverter means, wherein the commonly connected drain of said other one of said complementary transistor pairs is connected to an input node of said output inverter means.

12. A digital level shifting circuit having a single voltage supply, comprising:

input inverter means for inverting an input signal characterized by a first peak voltage level to produce therefrom an inverted signal;

voltage generator circuit means energized by said voltage supply for providing an internally generated supply voltage different from the voltage of said single voltage supply to said input inverter means, latch means energized by said voltage supply and having two branches, each of said branches having a pair of complementary transistors, each pair having commonly connected drains and gates, the commonly connected gate of one of said transistor pairs being connected to receive said inverted signal, whereby at the commonly connected drain of the other transistor pair is produced a shifted voltage characterized by a second peak voltage level corresponding to the level of said voltage supply, said voltage generator circuit means comprising:

capacitor means;

a source follower transistor connected between said voltage supply source and said capacitor means, said source follower transistor having a gate connected to receive said input signal; and directional switching means connected between said source follower transistor and said capacitor means for preventing discharge of said capacitor means through said source follower means, whereby said capacitor means compensates for fluctuations in the source voltage of said source follower transistor, said capacitor means being further connected to said input inverter so as to furnish said internally generated supply voltage to said input inverter, said directional switching means comprising a switching transistor having a source and a gate connected together and having a drain connected to said capacitor means, said source follower transistor and said switching transistor having channels which are connected together.

* * * * *